US006972258B2

(12) United States Patent  
Chu et al.

(10) Patent No.: US 6,972,258 B2
(45) Date of Patent: Dec. 6, 2005

(54) METHOD FOR SELECTIVELY CONTROLLING DAMASCENE CD BIAS

(75) Inventors: Yin-Shen Chu, Taichung (TW); Hung-Ming Chen, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 117 days.

(21) Appl. No.: 10/634,086

(22) Filed: Aug. 4, 2003

(65) Prior Publication Data

US 2005/0032354 A1 Feb. 10, 2005

(51) Int. Cl.[7] .......................................... H01L 21/461
(52) U.S. Cl. ...................... 438/689; 438/700; 438/712
(58) Field of Search ................................ 438/689, 700, 438/712, 7

(56) References Cited

U.S. PATENT DOCUMENTS

| 6,451,703 B1 * | 9/2002 | Liu et al. .................. 438/710 |
| 6,613,689 B2 * | 9/2003 | Liu et al. .................. 438/712 |
| 6,632,746 B2 * | 10/2003 | Kanegae et al. ........... 438/706 |
| 6,638,853 B1 * | 10/2003 | Sue et al. .................. 438/633 |
| 6,716,571 B2 * | 4/2004 | Gabriel et al. ............. 430/313 |
| 6,787,455 B2 * | 9/2004 | Tsai et al. .................. 438/638 |
| 2004/0087167 A1 * | 5/2004 | Huang et al. .............. 438/694 |
| 2004/0192058 A1 * | 9/2004 | Chu et al. .................. 438/710 |

* cited by examiner

Primary Examiner—David S. Blum
(74) Attorney, Agent, or Firm—Randy W. Tung; Tung & Associates

(57) ABSTRACT

A method for selectively etching a semiconductor feature opening to controllably achieve a critical dimension accuracy including providing a semiconductor wafer including a first opening formed extending through a thickness of at least one dielectric insulating layer and having an uppermost inorganic BARC layer; depositing a photoresist layer over the uppermost BARC layer and patterning the photoresist layer to form an etching pattern for etching a second opening overlying and encompassing the first opening; carrying out a first plasma assisted etching process to etch through a thickness of the BARC layer including a predetermined amount of CO in a plasma etching chemistry to increase an etching resistance of the photoresist layer; and, carrying out a second plasma assisted etching process to etch through a thickness portion of the at least one dielectric insulating layer to form the second opening.

20 Claims, 2 Drawing Sheets

METHOD FOR SELECTIVELY CONTROLLING DAMASCENE CD BIAS

FIELD OF THE INVENTION

This invention generally relates to multi-layered semiconductor device micro-integrated circuitry and more particularly to a method for forming damascene and dual damascene openings in dielectric insulators with selective control over CD bias specifications in integrated micro-circuit manufacture.

BACKGROUND OF THE INVENTION

The escalating requirements for high density and performance associated with ultra large scale integration semiconductor wiring require increasingly sophisticated interconnection technology. As device sizes decrease it has been increasingly difficult to provide interconnection technology that satisfies the requirements of low resistance and capacitance interconnect properties, particularly where submicron inter-layer interconnects and intra-layer interconnects have increasingly high aspect ratios (e.g., an interconnect opening depth to opening diameter (or linewidth) ratio). As device sizes decrease below about 0.25 microns and lower, aspect ratios have generally increased to greater than about 4. In particular, high aspect ratio interconnects frequently require carefully controlled critical dimension (CD) etching profiles, including angled sidewalls to achieve adequate step coverage and desired electrical properties.

CD bias is generally determined by optical methods, for example using a scanning electron microscope (SEM) following various steps in integrated circuit manufacturing. For example, at various steps in forming damascene openings in dielectric insulating layers, the CD bias is examined to determine that the patterned and etched opening are within design specifications. CD bias inspections may be made at various stages including following photoresist development, referred to as after development inspection (ADI), following an etching process, referred to as after etch inspection (AEI), and following photoresist and etching residue stripping, referred to as after stripping inspection (ASI).

In plasma assisted etching of openings to form structures, for example damascenes, generally the sidewall profiles of an etched opening are controlled by various factors including etching chemistry where etching polymers formed from fluorocarbon and hydrofluorocarbon etching chemistries combine with etching byproducts to form polymers which are deposited on opening sidewalls during etching. A greater amount of the polymer is deposited on the upper portion of the opening during etching serving to protect it from isotropic etching and acting to shadow underlying portions of the opening as etching proceeds anisotropically downwards. A tapered profile defined by a sidewall angle thereby results where the sidewall tapers at an angle from a narrower bottom portion of the opening to a relatively larger opening at the upper portion.

Depending on the integrated circuit application and subsequent processes, a predetermined CD bias of the upper portion of the opening together with a sidewall angle is frequently desirable. For example, a predetermined tapered sidewall angle may be desirable to achieve electrical property design constraints as well as to improve step coverage of an overlying deposited layer.

As feature sizes in anisotropic etching process have diminished, photolithographic patterning processes require activating light (radiation) of increasingly smaller wavelength. For 0.25 micron and below CMOS technology, deep ultraviolet (DUV) photoresists have become necessary to achieve the desired resolution. Typically DUV photoresists are activated with activating light source wavelengths of less than about 250 nm, for example, commonly used wavelengths include 193 nm and 248 nm. Many DUV photoresists are chemically amplified using a photoacid generator activated by the light source to make an exposed area soluble in the development process.

One problem with achieving desired feature dimensions is the tendency of the photoresist to shrink during development and post exposure bake processes due to the loss of solvents. Consequently, a patterned etch opening may be slightly larger than desired even prior to etching. Another problem with the prior art in achieving the desired control over CD bias in etched openings, for example, with linewidths and opening diameters less than about 0.25 microns, including 0.13 microns and less, is that patterned photoresists forming a patterned etch opening do not have the desired selectivity (or resistance) to an etching plasma chemistry, frequently resulting in a degree of overetching or undercutting of the sidewalls of the photoresist pattern. Consequently an etched opening is produced with an out of specification CD bias in underlying etched layers, for example resulting in a slightly larger opening dimension than desired.

There is therefore a need in the semiconductor processing art to develop a method to reliably etch semiconductor feature openings in material layers to achieve desired opening dimensions within design tolerances thereby improving semiconductor device reliability and increasing semiconductor device yield.

It is therefore an object of the invention to provide a method to reliably etch semiconductor feature openings in material layers to achieve desired opening dimensions within design tolerances thereby improving semiconductor device reliability and increasing semiconductor device yield while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for selectively etching a semiconductor feature openings to controllably achieve a critical dimension accuracy.

In a first embodiment, the method includes providing a semiconductor wafer including a first opening formed extending through a thickness of at least one dielectric insulating layer and having an uppermost inorganic BARC layer; depositing a photoresist layer over the uppermost BARC layer and patterning the photoresist layer to form an etching pattern for etching a second opening overlying and encompassing the first opening; carrying out a first plasma assisted etching process to etch through a thickness of the BARC layer including a predetermined amount of CO in a plasma etching chemistry to increase an etching resistance of the photoresist layer; and, carrying out a second plasma assisted etching process to etch through a thickness portion of the at least one dielectric insulating layer to form the second opening.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Although the method of the present invention is explained by exemplary reference the formation of a via-first method of formation of a dual damascene structure in a multi-level semiconductor device, it will be appreciated that the method of the present invention is equally applicable to plasma assisted etching of other structures including single damascenes as well as a trimming process where the opening dimension is adjusted or a sidewall profile adjusted by etching a larger sized opening to at least partially encompass an underlying opening. In general, the method is applicable to the plasma assisted etching of openings in semiconductor material layers, including dielectric insulating layers where an overlying patterned photoresist layer is present as an etching mask. It will be appreciated that the etched opening formed according to a plasma assisted etching process in the method of the present invention may be subsequently lined or filled with a variety of materials including barrier layers, metals including copper, copper alloys, tungsten, and aluminum.

Figure 1A:
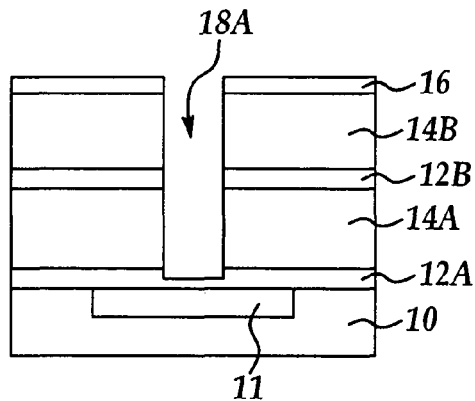
FIGS. 1A–1F are exemplary cross sectional views of a dual damascene structure at stages in a manufacturing process according to an embodiment of the present invention.

For example, in an exemplary embodiment, referring to FIGS. 1A–1F, are shown cross sectional views of a portion of a multi-level semiconductor device at stages in a dual damascene manufacturing process. Referring to FIG. 1A is shown a conductive region 11, for example, copper, formed in a dielectric insulating layer 10, having formed thereover a overlying first etching stop layer 12A, for example, silicon nitride (e.g., SiN, $Si_3N_4$) or silicon carbide (e.g., SiC). First etching stop layer 12A is formed by a conventional chemical vapor deposition (CVD) process including for example, LPCVD or PECVD, having a thickness of about 300 Angstroms to about 700 Angstroms.

Still referring to FIG. 1A, formed over first etching stop layer 12A is first dielectric insulating layer 14A, also referred to as an inter-metal dielectric (IMD) layer formed of, for example, fluorinated silicate glass (FSG), undoped silicate glass (USG), or a low-k (low dielectric constant) silicon oxide based material, e.g., carbon doped silicon dioxide, preferably having a dielectric constant of less than about 3.0. Typically, the first IMD layer 14A is formed having a thickness of about 3000 to about 8000 Angstroms.

Still referring to FIG. 1A, following deposition of the first IMD layer 14A, a second etching stop layer 12B is formed in a similar manner using similar materials and thickness as the first etching stop layer 12A. Typically, in a dual damascene process, the second IMD layer 14B (trench layer) is formed having a thickness about the same or slightly less than the first IMD layer 14A (via layer). Formed over the second IMD layer 14B is a bottom anti-reflectance coating (BARC) layer 16 formed in odd increments of quarter wavelength thicknesses to reduce undesired light reflections from the IMD layer surface e.g., 14B, during subsequent photolithographic patterning processes. For example, the BARC layer 16 is preferably formed of silicon oxynitride (e.g., SiON), but may be formed of silicon oxycarbide (e.g., SiOC), and titanium nitride (TiN) in an LPCVD or PECVD process to a thickness of about 200 to about 1000 Angstroms. It will be appreciated that a single IMD layer, e.g., 14A without the intervening second etch stop layer e.g., 12B may also be used for forming a dual damascene structure.

Still referring to FIG. 1A, a via etching pattern is first formed according to a conventional photolithographic patterning process followed by a conventional reactive ion etching (RIE) step to form via opening 18A. For example, the RIE etching (plasma assisted etching) step includes sequential etching steps including conventional plasma etching chemistries formed of combinations of gases including hydrofluorocarbons, fluorocarbons, nitrogen, and oxygen to sequentially etch through a thickness of the BARC layer 16, the second IMD layer 14B, the second etching stop layer 12B, the first IMD layer 14A, and partially through a thickness of the first etching stop layer 12A.

Figure 1B:
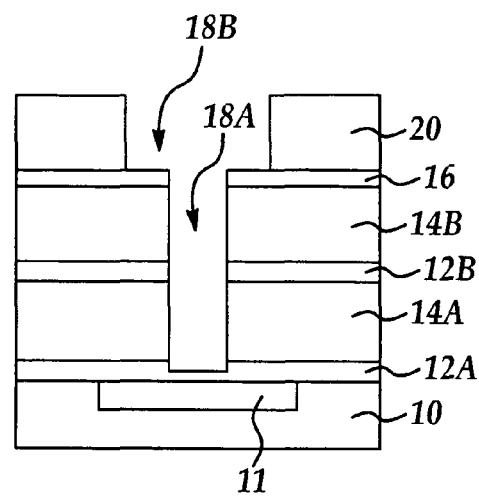

Referring to FIG. 1B, a second photolithographic patterning process is then carried out including blanket depositing photoresist layer 20 which is exposed and developed to pattern a trench line opening 18B etch pattern opening overlying and encompassing via opening 18A. It will be appreciated that the trench line opening pattern may encompass more than one via opening.

Figure 1C:
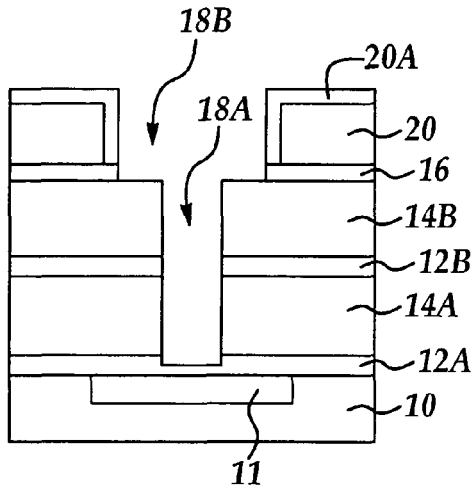

Referring to FIG. 1C, according to an aspect of the present invention, a CO containing plasma chemistry is used in a first plasma assisted etching (e.g., RIE) step, also referred to as a breakthrough etch, to etch through the BARC layer 16 thickness. Other conventional etching chemistry gases used in an RIE etch process to etch through inorganic BARC layers such as silicon oxynitride layers are preferably used in the breakthrough etch process. For example, an etching chemistry including at least one of hydrofluorocarbons, perfluorocarbons, and fluorocarbons are preferably used in addition to nitrogen ($N_2$) and inert diluent (carrier) gases such as argon or helium. In a preferred embodiment, a CO containing plasma source gas is formed by providing CO premixed with an inert carrier gas such as argon or individually supplied to the plasma source gas, to provide a CO volumetric concentration of from about 3% to about 20% by volume of the respective plasma gas source volume, depending on the desired CD etching bias in a subsequent trench line opening etching process. For example, as the amount of CO in the etching chemistry is increased the etched opening dimension becomes smaller, altering a CD etch bias in a subsequent trench line opening etching process.

For example, in a preferred embodiment, the breakthrough etch process includes plasma operating conditions including plasma reactor operating conditions of a pressure of about 30 milliTorr to about 200 milliTorr; an RF power of about 200 to about 1000 Watts, more preferably between about 400 Watts and about 800 Watts; plasma source gas flow rates of about 5 to about 20 sccm of fluorocarbons such as $CF_4$ and $C_4F_8$; a CO flow rate of about 10 sccm to about 100 sccm; and a flow rate of argon of about 100 sccm to about 500 sccm. A process wafer temperature is preferably maintained between about 20° C. and about 80° C. during the etching process. The breakthrough etch process (including the CO containing plasma treatment) is preferably carried out for a period of about 20 to about 100 seconds. It will be appreciated that a separate CO plasma treatment may be carried out prior to the breakthrough etch process, however, a simultaneous breakthrough etch with a predetermined amount of CO added (CO plasma treatment) is preferred since the CD bias in the subsequent trench etching process has been found to be more accurately controlled in response to a predetermined CO concentration.

According the method of the present invention, it has been found that the addition of the preferred amounts of CO during the breakthrough etch process advantageously promotes the formation of a hardened cross-linked shell 20A of photoresist in a photoresist thickness (e.g., form about 10 Angstroms to about 100 Angstroms) adjacent the surface portion including sidewalls of the photoresist layer 20. As a result, the etching resistance (selectivity) of the photoresist shell 20A is increased during the breakthrough etching process allowing a greater degree of control over the subsequent dimension (critical dimension) of the upper portion of the etched trench opening during a subsequent second RIE etch step to etch through a thickness of IMD layer 14B. Although the precise mechanism for inducing hardening in the photoresist layer surface portion is not precisely known, it is believed the CO plasma treatment promotes the formation of carbon-carbon and/or carbon-oxygen-carbon bonds between monomer substituents of the photoresist polymer resin to create additional cross-linking to form a higher cross-linking density, for example forming a 3-dimensional cross-linked network in the photoresist.

The degree of cross-linkage (photoresist hardening) in the photoresist layer is in addition to that achieved by separate deep ultraviolet light (DUV, e.g., less than about 300 nm) treatments for novolak resin photoresists and/or a post development hard bake (PDHB) process of novolak (I-line) and DUV photoresists. The CO plasma treated photoresist results in selectable CD control not readily achievable by DUV and/or PDHB treatment processes alone. It will be appreciated that a DUV and/or PDHB process may be undertaken prior to the CO plasma treatment (e.g., first etching process), or the CO plasma treatment may be undertaken as the primary photoresist hardening process following photoresist development. Preferably, at least a PDHB process is carried out prior to the CO plasma treatment process. For example, the PDHB process is typically carried out from about 130° C. to about 200° C., depending on the glass transition temperature of the photoresist polymer (resin) and whether the photoresist layer has undergone a DUV hardening treatment prior to the PDHB process.

Preferable photoresists for forming the photoresist layer 20 and hardened shell portion 20A include, but are not limited to, conventional I-line photoresists including novolak resins and diazonapthoquinone (DNQ) photosensitizers and DUV photoresists including photo-acid generators (PAG). Exemplary photoresists that have been advantageously used according to preferred embodiments include SEPR 432, and SEPR 450 available from Shin-Etsu of Tokyo, Japan. Suitable photoresists may include one or more polymer types (co-polymers), for example, polyhydroxystyrene based polymer resins are suitably used with the method of the present invention. For example, polyhydroxystyrene based resins including butylacrylate and hydroxystyrenes groups may be suitably used. In addition, polymer resins including acrylate groups such as polymethylmethacrylate (PMMA) and cyclic olefin polymers may be suitably used in the method of the present invention. Suitable photoresists may include organic solvents such as propylene glycol methyl ether acetate (PGMEA), propylene glycol methyl ether (PGME), ethyl lactate, methyl 3-methoxypropionate, ethyl 3-ethoxypropionate and cyclohexanone. Any conventional photo-acid generator (PAG) as are known in the art may be included in the photoresist.

Figure 1D:
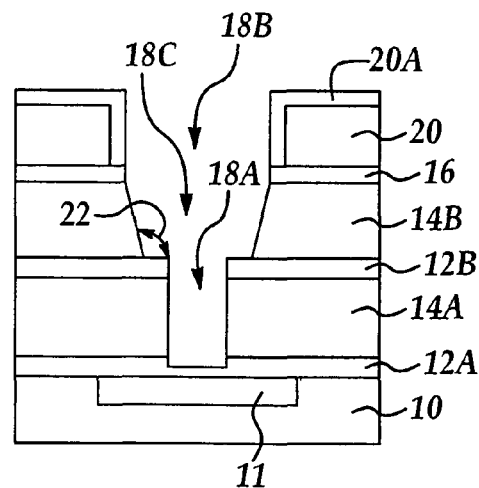

Referring to FIG. 1D, following the breakthrough plasma assisted etch (e.g., RIE) process including a predetermined amount of CO to simultaneously accomplish a CO plasma treatment of the photoresist layer 20 and a breakthrough etch process, a conventional plasma chemistry is used in a second plasma assisted etch process (e.g., RIE) to etch through a thickness portion of the IMD layer 14B, for example, stopping on etch stop layer 12B to form trench opening 18C overlying and encompassing via opening 18A. In one embodiment, a tapered sidewall angle (theta) 22 defined with respect to a horizontal level in the multi-layered process wafer is formed by controlling a carbon to fluorine etching chemistry ratio and controllably adjusting the CD bias of the opening level of the trench opening 18C.

Figure 1E:
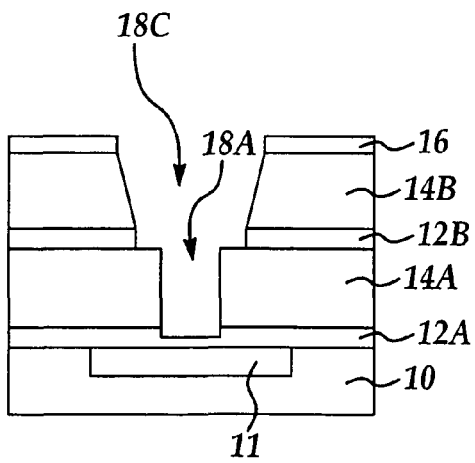

Referring to FIG. 1E, a dry ashing process is then carried out to remove the photoresist layer 20, including the CO hardened portion 20A and a conventional third etch step is carried out to etch through a thickness of the second etch stop layer 12B and etch through a thickness of a remaining portion of first etch stop layer 12A is carried out to form closed communication of the via opening 18A with underlying conductive region 11. Advantageously, the dry ashing process including both oxygen and $CF_4$ has been found to suitably remove both the CO plasma treated (hardened) portions and untreated (not CO hardened) portions of the photoresist layer as well polymeric etching residues within the via and trench openings. In addition, a conventional wet stripping process may be optionally carried out following the dry ashing process to complete removal of polymeric etching residues.

It has been found, according to exemplary embodiments of the present invention that the dimension of the upper portion of a via and/or trench openings may be selectively controlled over a range of about 5 nanometers to about 25 nanometers by controlling the amount of CO added to the breakthrough etching chemistry over a range of about 3% to about 20% by volume of the etching chemistry total gas volume. For example, in the context of forming a tapered opening a tapered sidewall angle of the trench opening with respect to a bottom portion of the opening, e.g., angle 22 in FIG. 1D, may be controlled over a range of about 0.2 degrees to about 2 degrees, for example between about 85 degrees and about 87 degrees. In addition it has been found that the addition of a predetermined amount of CO according to preferred concentrations in the breakthrough etch has no effect on the degree of polymeric etching residue deposition on the sidewalls allowing tapered sidewalls to be controllably produced with desired tapered sidewall angles and opening level critical dimensions. For example, the CD bias of the opening level may be increased or decreased, depending on the amount of CO added to the breakthrough etching chemistry over a range of about 2% to about 10% of the opening linewidth or diameter. Various process wafer performance testing and benchmarks assessed following exemplary implementation of the present invention in a 0.13 micron process showed CD results that were controllable to selectively achieve CD design goals, which have been unachievable by other CD control approaches.

Figure 1F:
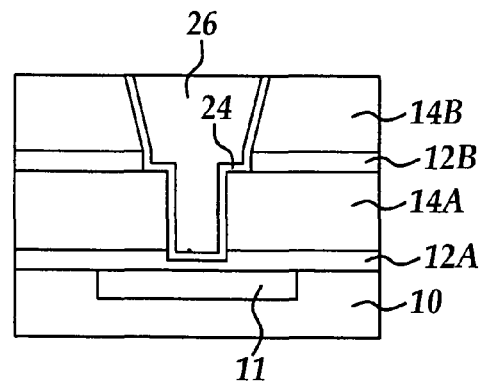

Referring to FIG. 1F, the dual damascene structure is then completed according to conventional processes. For example, the dual damascene opening is filled with metal, for example, a copper filling 26 according to an electrodeposition process followed by a CMP process to remove excess copper above the trench opening to complete the formation of a dual damascene. Prior to electrodeposition of copper, a barrier/adhesion layer e.g., 24 of, for example, tantalum nitride, is blanket deposited to line the dual damascene structure, followed by deposition of a copper seed layer (not shown) to provide an electrodeposition surface. During the subsequent CMP process the process surface is planarized above the trench line opening level including removing the barrier layer 24 and BARC layer 16 to complete the formation of the dual damascene structure.

Figure 2:
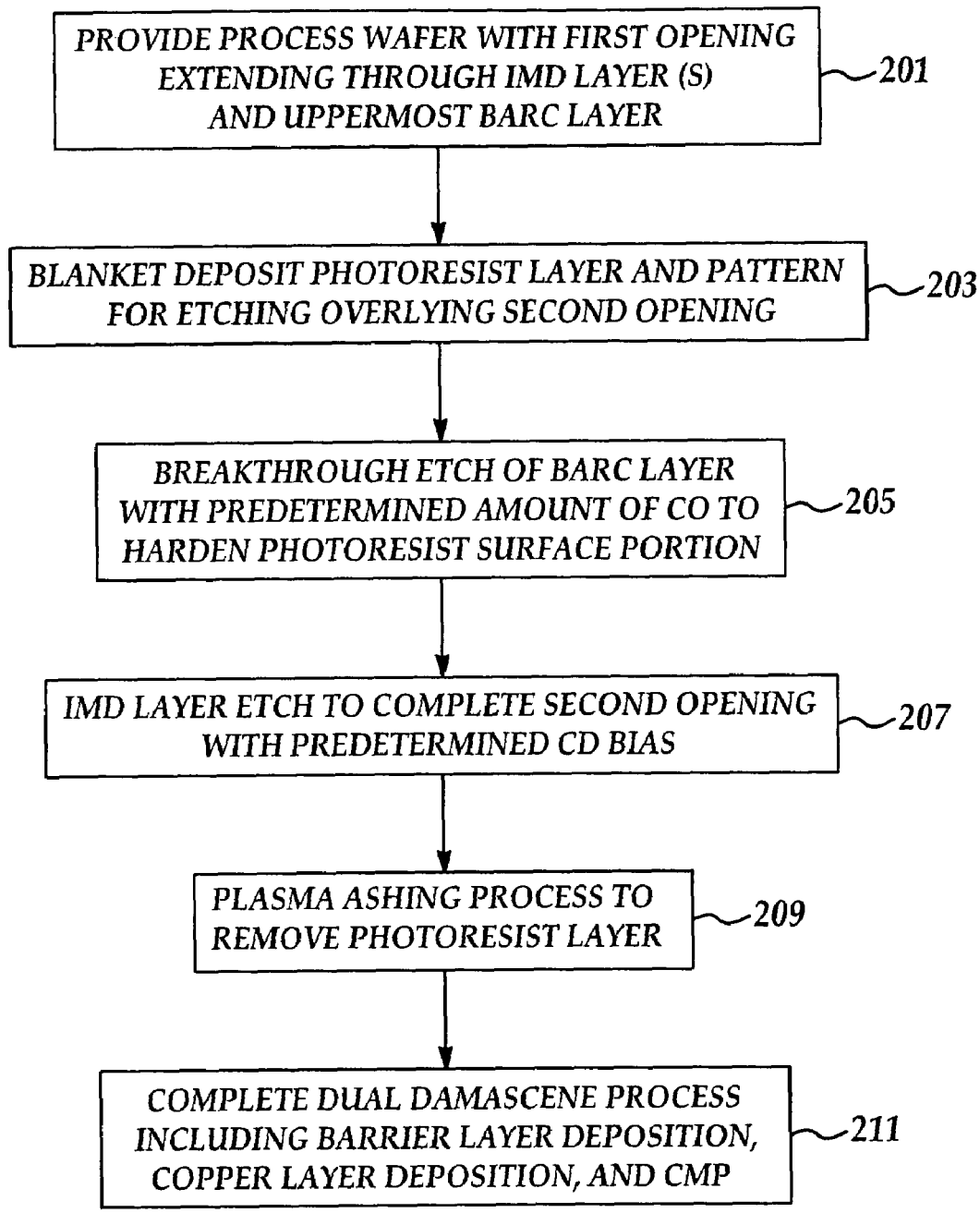
FIG. 2 is a process flow diagram including several embodiments of the present invention.

Referring to FIG. 2 is shown a process flow diagram including several embodiments of the present invention. In process 201, a semiconductor wafer comprising a first opening formed through a thickness portion of at least one dielectric insulating (IMD) layer including an inorganic BARC uppermost layer is provided. In process 203, a photolithographic patterning process is carried out to pattern a photoresist layer for etching a second opening overlying and encompassing the first opening. In process 205, a first RIE process is carried out to etch through a thickness of the inorganic BARC layer including adding a predetermined amount of CO to the etching plasma to harden the photoresist layer to selectively control a CD etch bias according to preferred plasma operation conditions. In process 207, subsequent RIE processes are carried out including etching through an IMD layer thickness portion to form the second opening. In process 209, an ashing process is carried out to remove the photoresist layer. In process 211, a several conventional processes are carried out to complete a dual damascene structure including deposition of barrier/adhesion layer, filling the first and second openings with a metal followed by a planarization process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for selectively etching a semiconductor feature openings to controllably adjust a critical dimension comprising an upper portion of a feature opening comprising the steps of:
   providing a semiconductor wafer comprising a first opening formed extending through a thickness of at least one dielectric insulating layer and having an uppermost inorganic BARC layer;
   depositing a photoresist layer over the uppermost BARC layer and patterning the photoresist layer to form an etching pattern for etching a second opening overlying and encompassing the first opening;
   carrying out a first plasma assisted etching process to etch through a thickness of the BARC layer comprising a predetermined amount of CO in a first plasma etching chemistry to form a predetermined critical dimension of a second opening upper portion including forming a hardened shell comprising the photoresist at the photoresist layer surface, said hardened shell having an increased etching resistance; and,
   carrying out a second plasma assisted etching process comprising a second plasma etching chemistry to etch through a thickness portion of the at least one dielectric insulating layer to form the second opening.

2. The method of claim 1, wherein the first and second openings comprise one a damascene and dual damascene structure.

3. The method of claim 1, wherein the inorganic BARC layer is formed of a material selected from the group consisting of silicon oxynitride, silicon oxycarbide, and titanium nitride.

4. The method of claim 1, wherein the photoresist layer is formed of a photoresist comprising one of an I-line novolak photoresist and a DUV photoresist.

5. The method of claim 1, wherein the photoresist layer comprises polymeric monomer groups selected from the group consisting of hydroxystyrenes and acrylates.

6. The method of claim 1, wherein the predetermined amount of CO comprises from about 3 percent to about 20 percent by volume of the plasma etching chemistry.

7. The method of claim 1, wherein the plasma etching chemistry comprising the first plasma assisted etching process consists essentially of at least one of a hydrofluorocarbon and fluorocarbon, nitrogen, an inert gas, and carbon monoxide.

8. The method of claim 7, wherein the first plasma assisted etching process operating conditions include an operating pressure of between about 30 milliTorr and about 200 milliTorr, an RF power of between about 200 Watts and about 1000 Watts, and a flow rate of CO between about 5 sccm and about 100 sccm.

9. The method of claim 1, wherein patterning the photoresist layer comprises at least one of an ultraviolet treatment process and a post development baking process following development of the photoresist.

10. The method of claim 1, further comprising the step of an ashing process comprising $CF_4$ and oxygen ($O_2$) to remove the photoresist layer following the step of carrying out a second plasma assisted etching process.

11. The method of claim 1, wherein the second opening is formed having a tapered sidewall angle defined by the second opening upper portion and a bottom portion of the second opening, said tapered sidewall angle between about 0.2 degrees and about 2 degrees.

12. A method for selectively etching a semiconductor feature openings to with an increased photoresist etching resistance to achieve a predetermined BARC opening critical dimension for controlling a feature opening sidewall profile comprising the steps of:
   providing a semiconductor wafer comprising a first opening formed extending through a thickness of at least one dielectric insulating layer and having an uppermost inorganic BARC layer;
   depositing a photoresist layer over the uppermost BARC layer and patterning the photoresist layer to form an etching pattern for etching a second opening overlying and encompassing the first opening;
   carrying out a first plasma assisted etching process comprising a first plasma etching chemistry having a predetermined amount of CO to etch through a thickness of the BARC layer to form an increased or decreased BARC opening portion critical dimension including increasing the photoresist layer etching resistance by inducing polymeric cross-linking reactions at the photoresist layer surface; and,
   carrying out a second plasma assisted etching process comprising a second plasma etching chemistry to etch through a thickness portion of the at least one oxygen containing dielectric insulating layer according to the BARC opening portion to form the second opening.

13. The method of claim 12, wherein the first and second openings comprise one of a damascene and dual damascene structure.

14. The method of claim 12, wherein the inorganic BARC layer is formed of a material selected from the group consisting of silicon oxynitride, silicon oxycarbide, and titanium nitride.

15. The method of claim 12, wherein the photoresist layer is formed of a photoresist selected from the group consisting of novolak resins, and DUV photoresists.

16. The method of claim 12, wherein the photoresist layer is formed of a photoresist comprising functional groups selected from the group consisting of hydroxystyrenes, acrylates, and cyclic olefins.

17. The method of claim 12, wherein the predetermined amount of CO comprises from about 5 percent to about 20 percent by volume of the plasma etching chemistry.

18. The method of claim 1, wherein the first plasma etching chemistry consists essentially of at least one of a hydrofluorocarbon and fluorocarbon, nitrogen, an inert gas, and carbon monoxide.

19. The method of claim 1, wherein patterning the photoresist layer comprises at least one of a deep ultraviolet (DUV) treatment process and a post development baking process following development of the photoresist.

20. The method of claim 1, wherein the the second opening is formed having a tapered sidewall angle defined by an upper portion of the second opening and a bottom portion of the second opening between about 0.2 degrees and about 2 degrees.

* * * * *